United States Patent [19]
Heid

[11] Patent Number: 6,043,651
[45] Date of Patent: Mar. 28, 2000

[54] METHOD FOR THE PHASE CORRECTION OF NUCLEAR MAGNETIC RESONANCE SIGNALS

[75] Inventor: Oliver Heid, Bern, Switzerland

[73] Assignee: Siemens Aktiengesellschaft, Munich, Germany

[21] Appl. No.: 09/056,755

[22] Filed: Apr. 8, 1998

[30] Foreign Application Priority Data

Apr. 11, 1997 [DE] Germany .................. 197 15 113

[51] Int. Cl.⁷ .................................................. G01V 3/00
[52] U.S. Cl. .................... 324/307; 324/309; 324/218
[58] Field of Search ...................... 324/307, 309, 324/318, 312

[56] References Cited

U.S. PATENT DOCUMENTS

| | | | |
|---|---|---|---|
| 4,644,279 | 2/1987 | Hoshino et al. ............... | 324/307 |
| 4,970,457 | 11/1990 | Kaufman et al. ............. | 324/307 |
| 5,138,259 | 8/1992 | Schmitt et al. ................ | 324/307 |
| 5,581,184 | 12/1996 | Heid ............................. | 324/307 |
| 5,869,965 | 2/1999 | Du et al. ...................... | 324/309 |

OTHER PUBLICATIONS

"Phase Correction for EPI Using Internal Lines," Jesmanowicz et al., Proc. of the Soc. of Mag. Res. in Medicine, vol. 3, 12$^{th}$ Annual Scientific Meeting, Aug. 14–20, 1993, p. 1239.

"A New Phase Correction Method in NMR Imaging Based on Autocorrelation and Histogram Analysis," Ahn et al., IEEE Trans. on Med. Imaging, vol. NI–6, No. 1, Mar. 1987, pp. 32–36.

*Primary Examiner*—Christine K. Oda
*Assistant Examiner*—Brij B. Srivastav
*Attorney, Agent, or Firm*—Hill & Simpson

[57] ABSTRACT

In a method for the phase correction of nuclear magnetic resonance signals given a pulse sequence wherein image echos are acquired under readout gradients of alternating operational sign, first and third reference echos ($S_1^+$, $S_3^+$) are acquired under sub-pulses of the readout gradient with a first polarity and a second reference echo ($S_2^-$) is acquired under a sub-pulse of the opposite polarity. An interpolation echo ($S_2^+$) that fictitiously occurs at the echo time of the second reference echo ($S_2^-$) is formed by interpolation from the first and third reference echo ($S_1^+$, $S_3^+$). Correction data are determined by comparing the second reference echo ($S_2^-$) to the interpolation echo ($S_2^+$).

3 Claims, 4 Drawing Sheets

METHOD FOR THE PHASE CORRECTION OF NUCLEAR MAGNETIC RESONANCE SIGNALS

BACKGROUND OF THE INVENTION

1. Field of the Invention

The present invention is directed to a method for phase correction of nuclear magnetic resonance signals of the type wherein image echos are acquired under readout gradients of alternating operational sign, and are entered row-by-row into a raw data matrix.

2. Description of the Prior Art

In a magnetic resonance imaging technique known as echo planar imaging (EPI), nuclear magnetic resonance signals are generated in rapid sequence as gradient echos in the readout phase by continuously changing of the polarity of a readout gradient. Due to the changing polarity of the readout gradient, the samples acquired from the nuclear magnetic resonance signals must be entered into a raw data matrix such that the direction of entry changes from row to row of the raw data matrix. If even slight deviations occur from row to row, this leads to an artifact known as N/2 ghosts, i.e. the actual image, given an image matrix of N×N points, is imaged again but shifted by N/2 in the positive and negative directions with reference to the middle of the image matrix, these ghosts generally arising in the image with a different intensity than the "true" image.

Several methods are known for solving this problem. U.S. Pat. No. 5,138,259 discloses a method wherein an adjustment scan is implemented before the actual measurement. This adjustment scan differs from the measurement only in that it is implemented without phase coding. A complete correction data matrix is acquired from which various inadequacies of the measuring system can be identified and correction data can be calculated for the actual measurement, however, the overall measuring time is noticeably lengthened with this method.

U.S. Pat. Nos. 4,644,279 and 4,970,457 disclose a technique wherein a nuclear magnetic resonance signal is acquired before the actual measurement, with at least one of the magnetic field gradients being shut off during this acquisition. This nuclear magnetic resonance signal is used for determining the basic magnetic field. Image disturbances that are produced by variations of the basic magnetic field can thus be eliminated.

Further, the publication Proceedings of the Society of Magnetic Resonance in Medicine, Vol. 3, $12^{th}$ Annual Scientific Meeting, 14–20 Aug. 1993, page 1239, discloses a technique wherein a phase coding pulse is omitted in the middle of the k-space. Two rows that are employed as reference values and which are acquired in a different direction of the k-space are thus obtained. After a Fourier transformation, relative time shifts are determined from the reference row in a two-stage method. The image data are corrected on the basis of the correction data acquired in this way. The method for acquiring the correction data, however, is rather complicated and a discontinuity in the data acquisition that can have a negative influence on the image quality arises due to the omission of a phase coding step.

IEEE Transactions on Medical Imaging, Vol. MI-6, No. 1, March 1987, pp. 32–36, discloses a phase correction method that, however, is not referred to the initially explained problem in the EPI method. Phase errors of the first order are thereby estimated by autocorrelation of the complex phase distortions of the image data, whereas a correction factor of the $0^{th}$ order is acquired from the histogram of the phase distribution of the image corrected with respect to the first order.

U.S. Pat. No. 5,581,184 discloses a pulse sequence wherein nuclear magnetic resonance signals are acquired successively under readout gradients with alternating operation signs. A navigator echo ($S_1^+$, $S_2^-$) is thereby respectively measured without phase coding under a positive sub-pulse and under a negative sub-pulse of the readout gradient. Correction data are then produced on the basis of these two navigator echos. It has been proven, however, that this known method leads only to incomplete correction data, i.e. N/2 ghosts are not completely eliminated.

SUMMARY OF THE INVENTION

An object of the present invention is to provide a method for the phase correction of nuclear magnetic resonance signals with improved correction data.

The above object is achieved in a method for phase correction of nuclear magnetic resonance signals wherein image echos are acquired under readout gradients of alternating operation sign and are entered row-by-row into a raw data matrix, wherein at least one reference echo of a first type is acquired under at least one pulse of a first polarity of the readout gradient, and wherein at least two reference echos of a second type are acquired under at least two pulses of the second polarity of the readout gradient, all of the reference echos exhibiting the same phase coding. At least one interpolation echo for the sampling time of at least one reference echo of the first type is determined by interpolation from the (at least) two reference echos of the second type. A correction dataset is determined on the basis of a comparison between the at least one interpolation echo and the time-allocated reference echos of the first type. The image echos are then corrected using the correction dataset.

DESCRIPTION OF THE PREFERRED EMBODIMENTS

The fundamentals of the EPI method are described below on the basis of the pulse diagrams of FIGS. 1 through 5. A more detailed description of the EPI method may be found in U.S. Pat. No. 4,165,479.

A radio-frequency pulse RF is emitted under the influence of a slice selection gradient $G_S$, this radio-frequency pulse RF exciting only a selected slice of the examination subject due to the slice selection gradient $G_S$. After the excitation, pre-phasing gradients $G_{RV}$ in a readout direction and $G_{PV}$ in a phase coding direction are activated. Subsequently, a readout gradient $G_R$ with individual pulses of alternating polarity is activated. Due to the alternating polarity, the arising nuclear magnetic resonance signal is dephased each time and then in turn rephased, so that the signal curve S shown in FIG. 5 arises.

During the readout phase, further, a phase coding gradient $G_P$ in the form of individual pulses is activated between the individual signals S. The phase coding gradient effects a phase coding that is stepped ahead in steps by the individual pulses. The readout gradients $G_R$, the phase coding gradients $G_P$ and the slice selection gradient $G_S$ reside perpendicular to one another.

The information about the spatial origin of the signal contributions needed for the image generation is coded in phase factors. For image acquisition, the acquired nuclear magnetic resonance signals S are measured as complex quantities by phase-sensitive demodulation. The acquired, analog nuclear magnetic resonance signals are sampled in a time grid, the samples are digitized and entered into a row of a raw data matrix M (shown in FIG. 6) per individual pulse of the readout gradient $G_R$. N complex values are read out under every individual pulse of the readout gradient $G_R$. These are entered sorted into a row of the raw data matrix M. A row index is referenced i and a column index is referenced j. N individual pulses of the readout gradient $G_{RO}$ follow each excitation, so that the raw data matrix contains N rows. An N×N raw data matrix is present overall. This raw data matrix represents a dataset known as a k-space, whereby the following definitions apply:

$$k_y(t) = Y \int_0^t G_y(t')dt'$$

$$k_x(t) = Y \int_0^t G_x(t')dt'$$

y=gyromagnetic ratio $G_R(t')$=momentary value of the readout gradient $G_R$ $G_P(t')$=momentary value of the phase coding gradient $G_P$.

Figure 1:
FIGS. 1–5 illustrate a known pulse sequence according to the EPI method for explaining the problem to which the inventive method is directed.
Figure 2:
Figure 3:
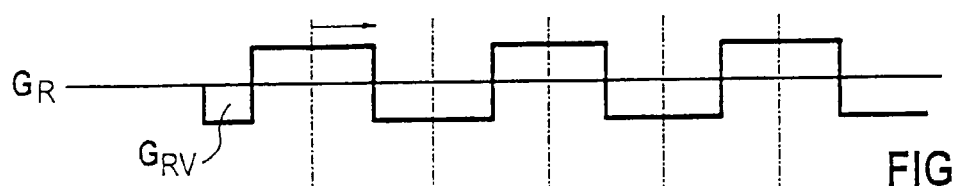
Figure 4:
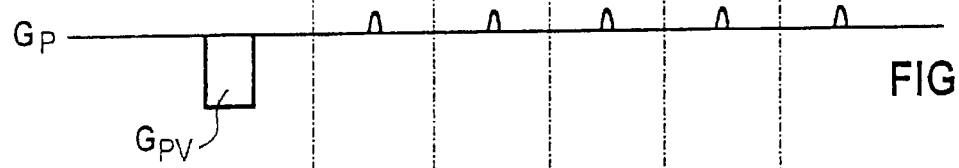
Figure 5:
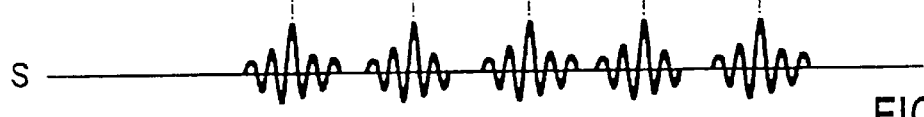
Figure 6:
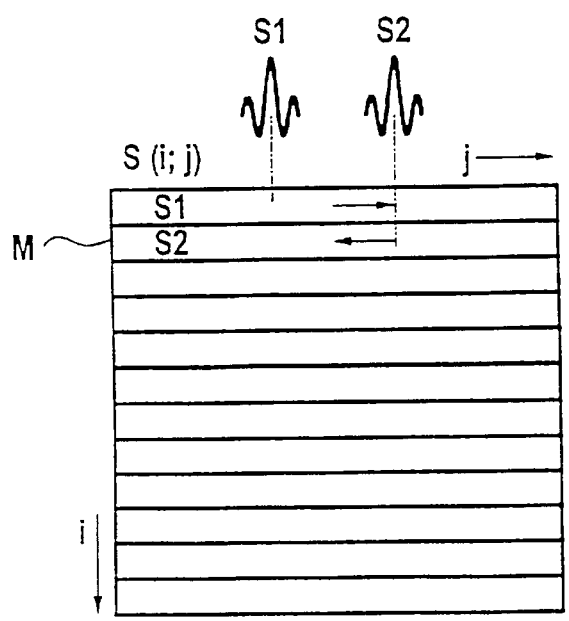
FIG. 6 shows the known entering of measured data into a raw data matrix in the EPI method.

Since the individual nuclear magnetic resonance signals are read out under alternating polarity of the readout gradient $G_R$, the measured values must likewise be entered into the raw data matrix M alternating with ascending j-values (column index values) and with descending j-values in the next row. The direction of the entry of the scanned and digitized nuclear magnetic resonance signals S1 and S2 is shown in FIG. 6.

An image can be acquired from the raw data matrix M (i.e., from k-space) using the relationship below via a two-dimensional Fourier transformation:

$$S(k_x,k_y) = \int\int \rho(x,y)e^{i(x \cdot k_x + y \cdot k_y)}dxdy,$$

whereby, in this case, the locus coordinate x lies in the direction of the readout gradient $G_R$, the locus coordinate y lies in the direction of the phase coding gradient $G_P$ and $\rho(x,y)$ is the nuclear spin density at the location x,y.

As initially mentioned, EPI images are susceptible to N/2 ghosts due to the alternating entry of the measured data. One cause for this can be, for example, that the sampling grid is not precisely adjusted relative to the middle of the readout gradient pulses $G_R$ or, stated in more general terms, that the gradient grid and the sampling grid for the nuclear magnetic resonance signals are shifted relative to one another. Such a shift of the gradient grid is indicated by an arrow in FIG. 3. FIG. 6 schematically shows the position of two nuclear magnetic resonance signals S1 and S2 given such a shift. Due to the shift of the gradient grid in the direction shown in FIG. 3, the signal maximums shift in every k-space row. Due to the alternating entry of the measured values, this—as shown in FIG. 6—results in, for example, the nuclear magnetic resonance signals S1 and S2 no longer lying precisely below one another in the raw data matrix M. Stated generally, the maximum positions of the nuclear magnetic resonance signals alternate from row to row of the raw data matrix M. It should be noted that, given pulse sequences with readout gradients not alternating in operational sign, the nuclear magnetic resonance signal maximums also reside under one another when the gradient time grid is shifted relative to the sampling time grid. This is because all samples are entered beginning from the same side of the raw data matrix.

Figure 7:
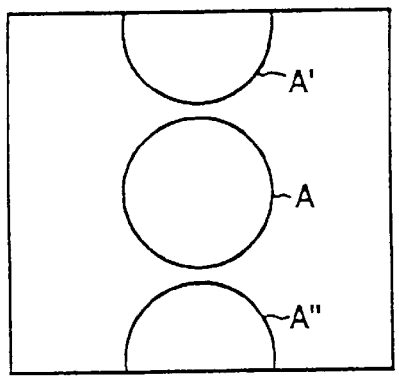
FIG. 7 shows the imaging of N/2 ghosts, as occur in the EPI method.
Figure 9:
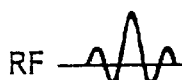
FIGS. 9–13 illustrate a pulse sequence with reference echos as an exemplary embodiment of the invention.
Figure 10:
Figure 11:
Figure 12:
Figure 13:
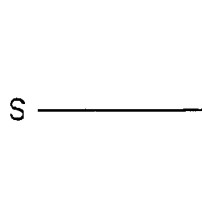

In EPI sequences, the sampling time for a sample of the nuclear magnetic resonance signal typically lies at 0.5 through 4 $\mu$s. It has been shown that time shifts between the gradient time grid and the sampling time grid must be less than 1/20 of this sampling time to avoid N/2 ghosts. Otherwise, a shift leads to N/2 ghosts as shown as an example in FIG. 7. A subject A is thereby shifted upwardly and downwardly respectively by half the row count of the overall image matrix, so that the ghost images A' and A" arise. The analog low-pass filtering always utilized in the signal editing can significantly contribute to this problem. Each filter exhibits a finite signal delay time that becomes longer as the filter becomes steeper in the frequency domain. The input signal is distorted in the positive time direction as a result of the causality principle. A signal shift with the above-presented consequences of the N/2 ghosts thus occurs.

After the Fourier transformation in the row direction, the explained signal shift leads to a linear phase response of the signal. Further, a constant phase error can also occur, for example given a drift of the basic magnetic field. Such a drift can be caused, for example, by eddy currents. After the Fourier transformation of the raw data matrix in row direction, an overall phase response $$\phi(i) = \phi_0 + i \cdot \Delta\phi_1$$

dependent on the column number i thus is obtained.

U.S. Pat. No. 5,581,184, which was initially cited, disclosed a method with which the constant as well as the linear term of the phase response is eliminated.

Figure 8:
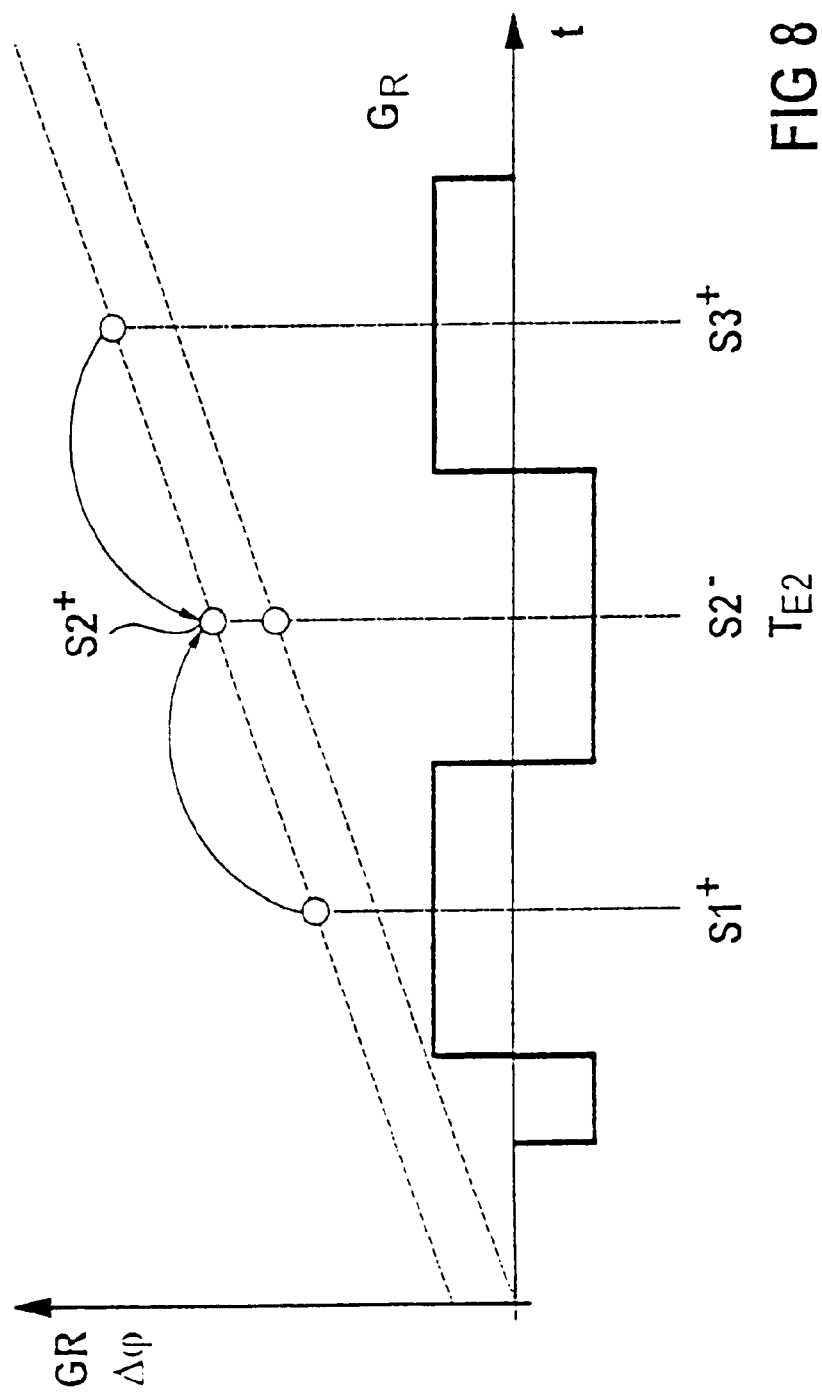
FIG. 8 illustrates the acquisition of correction data as exemplary embodiment of the invention.

The determination of correction data, however, is only imperfectly implemented given this known method. This is demonstrated below with reference to FIG. 8. FIG. 8 shows a pulse train of the readout gradient $G_R$ that precedes the actual image measurement. According to the aforementioned U.S. Pat. No. 5,581,184, two reference echos in the form of a nuclear magnetic resonance signal S1$^+$ under a positive sub-pulse of the readout gradient $G_R$ and a nuclear magnetic resonance signal S2$^-$ under a negative sub-pulse of the readout gradient $G_R$ are acquired. Both reference echos, i.e. the nuclear magnetic resonance signals S1$^+$ and S2$^-$, are acquired without the influence (presence) of a phase coding gradient.

It is then assumed in the aforementioned patent that the phase differences between the two nuclear magnetic resonance signals acquired respectively under the negative and positive sub-pulses represent the phase errors that ultimately lead to the initially explained N/2 ghosts. The following effect, however, was ignored in this consideration.

The two reference echos S1$^+$ and S2$^-$ have unavoidably different echo times, i.e. the echo time $T_{E1}$ of the reference echo S1$^+$ is smaller than the echo time $T_{E2}$ of the reference echo S2$^-$. If the local spin precession frequency in the subject does not coincide with the frequency set at the MR apparatus by the amount $\Delta\omega$, this leads to a phase difference $$\Delta\phi = \Delta\omega \cdot \Delta T_E$$

between the two reference echos that cannot be distinguished from the phase differences having a different source that are to be corrected per se. The rise of the phases $\Delta\phi$ due to off-resonance effects is shown with broken lines in FIG. 8.

When, for example, it is demanded that the N/2 ghost should have a relative strength intensity of <1:40, i.e. $\Delta\phi<\arctan 1/40 = 3°$ applies, whereby $\Delta T_E = 600$ μsec and $B_0 = 1.5$ Tesla, a demand of ±0.2 ppm is made of the field homogeneity, that can hardly be achieved in practice.

In the EPI pulse sequence, the off-resonance effect leads to a shift of the image in phase coding direction, but it does not cause any N/2 ghosts. When the phase development due to the off-resonance effect is allowed to enter into the determination of the reference echos of the S1$^+$ and S2$^-$, as in the aforementioned patent, then N/2 ghosts are reintroduced precisely as a result.

In conformity with an exemplary embodiment of the invention according to FIG. 8, this is avoided by measuring a third reference echo S3$^+$, this being measured under a positive sub-pulse of the readout gradient $G_R$ like the first reference echo S1$^+$. By suitable interpolation of the first reference echo S1$^+$ and of the third reference echo S3$^+$, an interpolation echo S2$^+$ can now be determined that corresponds to a reference echo S2$^+$ acquired under a positive sub-pulse at the measuring time of the second reference echo S2$^-$. In other words, reference echos for a negative as well as for a positive sub-pulse are obtained at a uniform echo time $T_{E2}$, whereby the reference echo S2$^-$ for the negative sub-pulse is actually measured and the reference echo S2$^+$ for an imaginary positive sub-pulse at time $T_{E2}$ is computationally determined as an interpolation echo. Since both reference echos (imaginary) arise at the same echo time $T_{E2}$, the problem that the measurement is falsified by off-resonance effects is overcome.

Given the assumption that the T2* relaxation influence during the measurement of the three navigator echos can be neglected:

$$T_{E_2} - T_{E_\phi} = \Delta T_{E21} \ll T_2^*$$

$$T_{E_3} - T_{E_2} = \Delta T_{E32} \ll T_2^*$$

one approximately obtains the sought interpolation echo S2$^+$ by $$S_2^+ = \frac{T_{E_3} - T_{E_2}}{T_{E_3} - T_{E_1}} S_1^+ + \frac{T_{E_2} - T_{E_1}}{T_{E_3} - T_{E_1}} S_3^+$$

whereby $T_{E1}$, $T_{E2}$ and $T_{E3}$ are the echo times of the reference echos S1$^+$, S2$^-$ and S3$^+$ respectively. Given a symmetrical gradient time curve, this interpolation is simplified to the complex arithmetic average:

$$S2^+ = \frac{S1^+ + S3^+}{2}$$

A complete EPI pulse sequence with preceding correction measurement is shown in FIGS. 9 through 13. The reference echos S1$^+$, S2$^-$ and S3$^+$ according to FIG. 8 are thereby determined in a time span $T_N$ before the actual measurement, the reference echo S2$^-$ and the reference echo S2$^+$ are employed for the following correction, rather than the reference echos S1$^+$ and S2$^-$.

The remaining correction sequences as disclosed in the aforementioned U.S. Pat. No. 5,581,184, i.e. the reference echos S2$^+$, S2$^-$, like all nuclear magnetic resonance signals, are demodulated with a phase-sensitive demodulator and sampled as complex quantities and digitized. Since no phase coding steps were implemented, however, a complete matrix is not obtained, but only a data row for the reference echos S2$^+$ and S2$^-$. Given exact centering of the reference echos S2$^+$, S2$^-$ in the gradient grid, the result after a Fourier transformation would be purely real, i.e. no phase response would be present. A lack of centering, however, leads to a linear phase response that can be determined on the basis of the following autocorrelation functions:

$$R^+ e^{i\Delta\phi_1^+} = \sum_{j=0}^{N-1} S2_j^+ S2_{(j-1)}^{+*}$$

$$R^- e^{i\Delta\phi_1^-} = \sum_{j=0}^{N-1} S2_j^- S2_{(j-1)}^{-*}$$

$S2_j^+$, $S2_j^-$ are thereby respectively the individual Fourier-transformed, complex samples, the asterisk (*) represents the conjugated complex quantity, $R^+$ and $R^-$ respectively represent the magnitude of the function, which is of no interest in this context, and $\Delta\phi_1^+$ represents the phase response in the positive reference echo S2$^+$ and $\Delta\phi_1^-$ represents the phase response of the negative reference echo S2$^-$. The linear phase response of the signal thus is obtained separately for echos under positive and negative gradients of the readout gradient $G_R$. It can be assumed that this phase response is the same for all following signals employed for the image acquisition, and their phase response can thus be corrected.

Due to the sum formation of the samples, an averaging over the subject ensues in the illustrated method for determining the phase response, so that reliable values are obtained. Since signal only comes from the subject region, practically only the relevant subject region is taken into consideration in the averaging.

A correction of the image signals can now be implemented with the phase responses for positive and negative pulse of the readout gradient acquired in this way, with the correction again being undertaken at the values of the raw data matrix Fourier-transformed in row direction. These values are referenced below as $H_{ij}$; the corresponding corrected values are referenced as $H_{ij}'$. The corrected values $H_{ij}'$ must be separately considered for signals under positive and negative pulses of the readout gradient $G_R$, i.e. even and odd row numbers i:

$$H_{ij}' = H_{ij} \cdot e^{-i(j-\frac{N}{2})\Delta\phi_1^+} \quad \text{for } i = 0(2)N-2, j = 0(1)N-1$$

$$H_{ij}' = H_{ij} \cdot e^{-i(j-\frac{N}{2})\Delta\phi_1^-} \quad \text{for } i = 0(2)N-1, j = 0(1)N-1$$

As already mentioned, there is not only a linear phase error $\Delta\phi_1$ but also a constant phase error $\phi_0$. This constant phase error $\phi_0$ can also be determined from the reference echos S2$^+$, S2$^-$. To that end, the linear phase response of the reference echos is itself corrected with the assistance of the values $\Delta\phi_1^+$, $\Delta\phi_1^-$, whereby the corrected values Fourier-transformed in row direction are referenced as $S2_j^{+'}$ and $S2_j^{-'}$:

$$S2_j^{+'} = S2_j^+ \cdot e^{-i(j-\frac{N}{2})\Delta\phi_1^+}$$

$$S2_j^{-'} = S2_j^- \cdot e^{-i(j-\frac{N}{2})\Delta\phi_1^-}$$

From the aforementioned values for $S2_j^{+'}$ and $S2_j^{-'}$, the phase difference $\phi_0$ between the two echos can now be calculated with the following cross-correlation, namely pixel by pixel in the matrix.

$$R \cdot e^{i\phi_0} = \sum_{j=0}^{N-1} S2_j^{+'} \left(S2_j^{-'}\right)^*$$

The image signals Fourier-transformed in the row direction now can be in turn corrected with the value of the constant phase shift $\phi_0$, likewise averaged over the subject, acquired in this way, with only a correction of the uneven echos being required:

$$H_{ij}'' = H_{ij}' \cdot e^{i\phi_0} \quad i = 1(2)N-1 \quad j = 0(1)N-1$$

Figure 14:
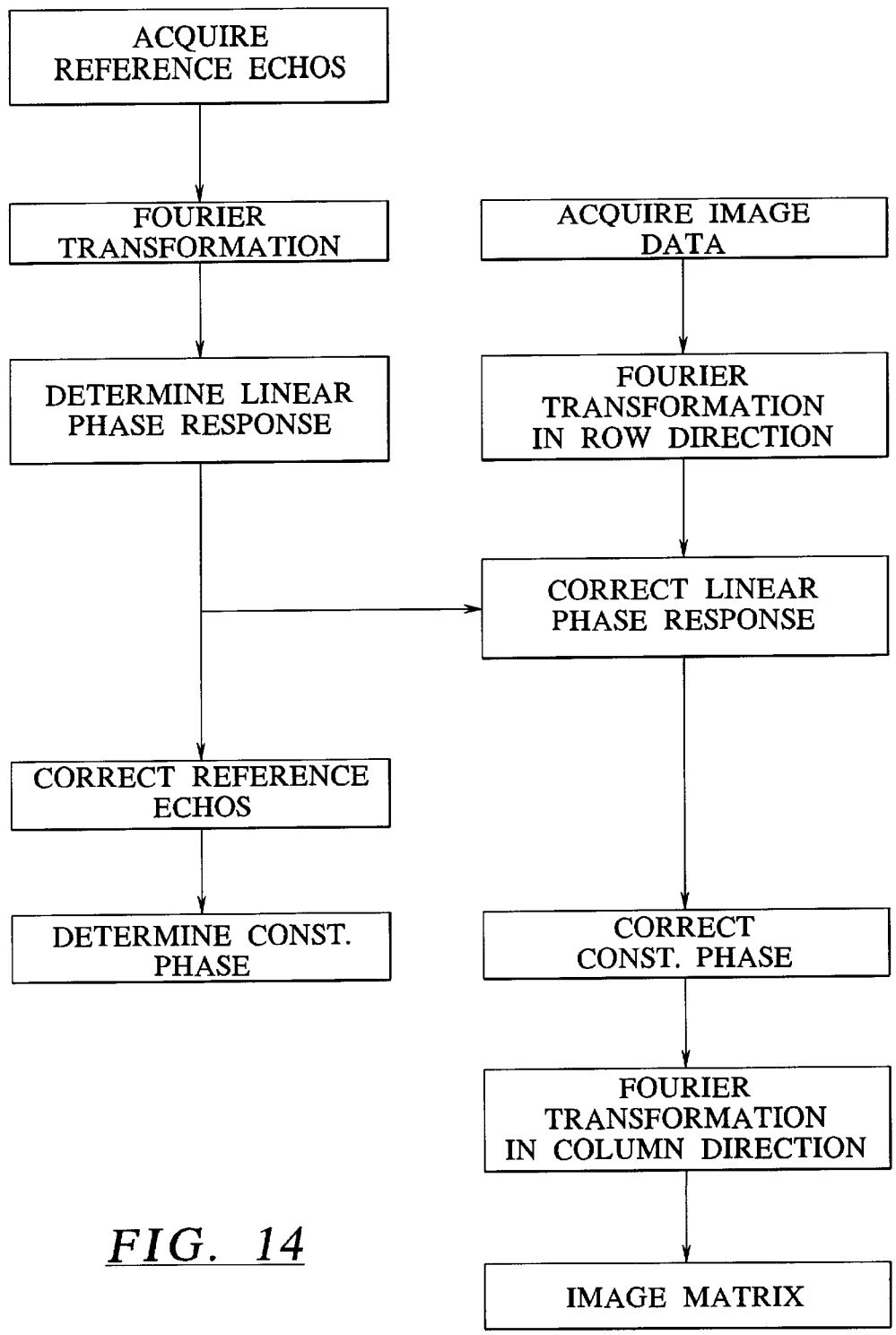
FIG. 14 is a flowchart of an exemplary embodiment of the invention.

The entire correction procedure is presented again in FIG. 14 in a flowchart. First, reference echos and image echos (image signals) are acquired. A Fourier transformation in the row direction ensues for the reference echos as well as for the image echos. A linear phase response, with whose assistance the image echos Fourier-transformed in row direction are corrected, is then respectively determined for both reference echos with the assistance of an auto-correlation function. Further, the reference echos themselves are corrected with the identified value of the linear phase response. A correction quantity $\phi_0$ for the constant phase response is obtained by cross-correlation of the corrected reference echos. A corresponding correction is applied to the image data. An image is finally obtained by Fourier transformation of the corrected matrix in column direction.

A phase correction of nuclear magnetic resonance signals in EPI sequences with respect to a constant as well as a linear term can be implemented with little outlay, particularly little time and calculating outlay, with the aforementioned method. Due to the averaging of the measured values utilized for the correction, the correction functions reliably and exactly. For the reasons set forth, the correction data acquired on the basis of the reference echos are not falsified by off-resonance effects.

Although modifications and changes may be suggested by those skilled in the art, it is the intention of the inventor to embody within the patent warranted hereon all changes and modifications as reasonably and properly come within the scope of his contribution to the art.

I claim as my invention:

1. For nuclear magnetic resonance signals each having a phase associated therewith, a method for correcting the phase of said nuclear magnetic resonance signals, comprising the steps of:

acquiring a plurality of image echos from a subject under successive pulses, of alternating operational sign, of a readout gradient;

acquiring at least one reference echo of a first type under at least one pulse of a first operational sign of said readout gradient, and acquiring at least two reference echos of a second type under at least two pulses of second polarity of said readout gradient, said at least one reference echo of a first type and said at least two reference echos of a second type all exhibiting equal phase coding;

determining at least one interpolation echo for a sampling time of said at least one reference echo of the first type by interpolation from said at least two reference echos of the second type;

producing a correction dataset by comparing each interpolation echo with each reference echo of the first type;

correcting said image echos using said correction dataset to produce corrected image echos; and entering said corrected image echos row-by-row into a raw data matrix.

2. A method as claimed in claim 1 wherein said readout gradient includes at least first, second and third successive pulses of alternating operational sign, and wherein said at least one interpolation echo is acquired by interpolating reference echos respectively acquired under said first and third pulses, and a reference echo acquired under said second pulse.

3. A method as claimed in claim 2, wherein said at least one interpolation echo is determined according to the following equation:

$$S_2^+ = \frac{T_{E_3} - T_{E_2}}{T_{E_3} - T_{E_1}} S_1^+ + \frac{T_{E_2} - T_{E_1}}{T_{E_3} - T_{E_1}} S_3^+$$

wherein $S1^+$=said reference echo under the first pulse $S2^-$=said reference echo under the second pulse $S3^+$=said reference echo under the third pulse $S2+$=said interpolation echo $T_{E1}, T_{E2}, T_{E3}$=echo times of the reference echos under the first, second and third pulses, respectively.

* * * * *